United States Patent
Chuang et al.

(10) Patent No.: US 9,257,347 B2
(45) Date of Patent: Feb. 9, 2016

(54) SYSTEM AND METHOD FOR A FIELD-EFFECT TRANSISTOR WITH A RAISED DRAIN STRUCTURE

(75) Inventors: Hak-Lay Chuang, Singapore (SG); Ming Zhu, Singapore (SG)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 443 days.

(21) Appl. No.: 13/599,642

(22) Filed: Aug. 30, 2012

(65) Prior Publication Data

US 2014/0061775 A1    Mar. 6, 2014

(51) Int. Cl.
  *H01L 21/8238* (2006.01)
  *H01L 21/8234* (2006.01)
  *H01L 27/112* (2006.01)
  *H01L 29/423* (2006.01)

(52) U.S. Cl.
  CPC ..... *H01L 21/823814* (2013.01); *H01L 21/823418* (2013.01); *H01L 21/823431* (2013.01); *H01L 21/823828* (2013.01); *H01L 21/823885* (2013.01); *H01L 27/11273* (2013.01); *H01L 29/42392* (2013.01)

(58) Field of Classification Search
  CPC ........... H01L 29/42392; H01L 21/823814; H01L 21/823418; H01L 21/823431; H01L 21/823821; H01L 27/11273
  USPC .............................. 257/328, 329, 401, 623
  See application file for complete search history.

(56) References Cited

U.S. PATENT DOCUMENTS

| | | | | |
|---|---|---|---|---|
| 8,742,492 B2* | 6/2014 | Chuang et al. | | 257/329 |
| 8,754,470 B1* | 6/2014 | Chuang et al. | | 257/329 |
| 8,969,949 B2* | 3/2015 | Chuang et al. | | 257/329 |
| 9,029,940 B2* | 5/2015 | Chuang et al. | | 257/329 |
| 2011/0115011 A1* | 5/2011 | Masuoka et al. | | 257/314 |
| 2014/0291616 A1* | 10/2014 | Park et al. | | 257/27 |

OTHER PUBLICATIONS

Unpublished U.S. Appl. No. 13/568,997, filed Aug. 7, 2012 entitled "A Device With a Vertical Gate Structure", 35 pages.

* cited by examiner

*Primary Examiner* — Jose R Diaz
(74) *Attorney, Agent, or Firm* — Haynes and Boone, LLP (57) ABSTRACT

A method for forming a field-effect transistor with a raised drain structure is disclosed. The method includes forming a frustoconical source by etching a semiconductor substrate, the frustoconical source protruding above a planar surface of the semiconductor substrate; forming a transistor gate, a first portion of the transistor gate surrounding a portion of the frustoconical source and a second portion of the gate configured to couple to a first electrical contact; and forming a drain having a raised portion configured to couple to a second electrical contact and located at a same level above the planar surface of the semiconductor substrate as the second portion of the transistor gate. A semiconductor device having a raised drain structure is also disclosed.

20 Claims, 11 Drawing Sheets

SYSTEM AND METHOD FOR A FIELD-EFFECT TRANSISTOR WITH A RAISED DRAIN STRUCTURE

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous problems have increased. As features become closer, current leakage can become more noticeable, signals can crossover more easily, and power usage has become a significant concern. The semiconductor integrated circuit industry has produced numerous developments in effort to continue the process of scaling. One of the developments is the potential replacement or supplementation of the conventional MOS field-effect transistor by the tunneling field-effect transistor (FET).

Tunneling FETs are promising devices that may enable further scaling of power supply voltage without substantially increasing off-state leakage currents due to its sub-60 mV/dec subthreshold swing. However, existing tunneling FETs have not been satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 1A:
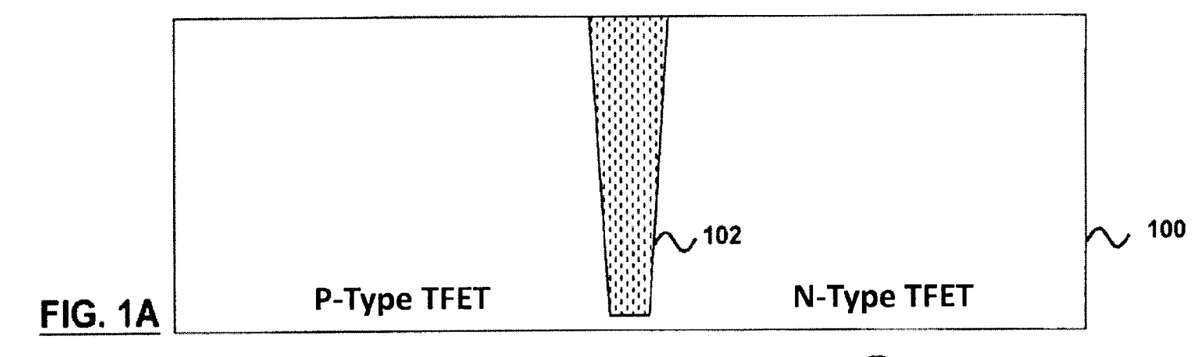
FIGS. 1A-1S are cross-sectional diagrams of a semiconductor substrate undergoing various processes in order to form an n-type tunneling FET and a p-type tunneling FET according to various embodiments of the present disclosure.
Figure 1B:
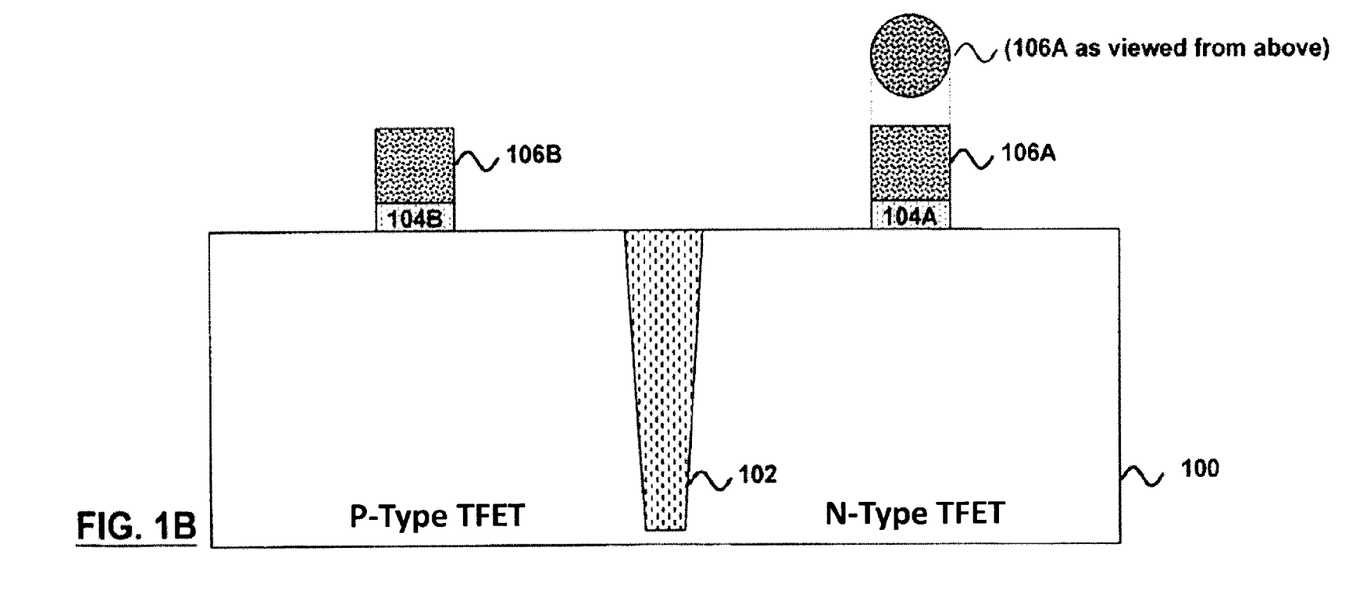
Figure 1C:
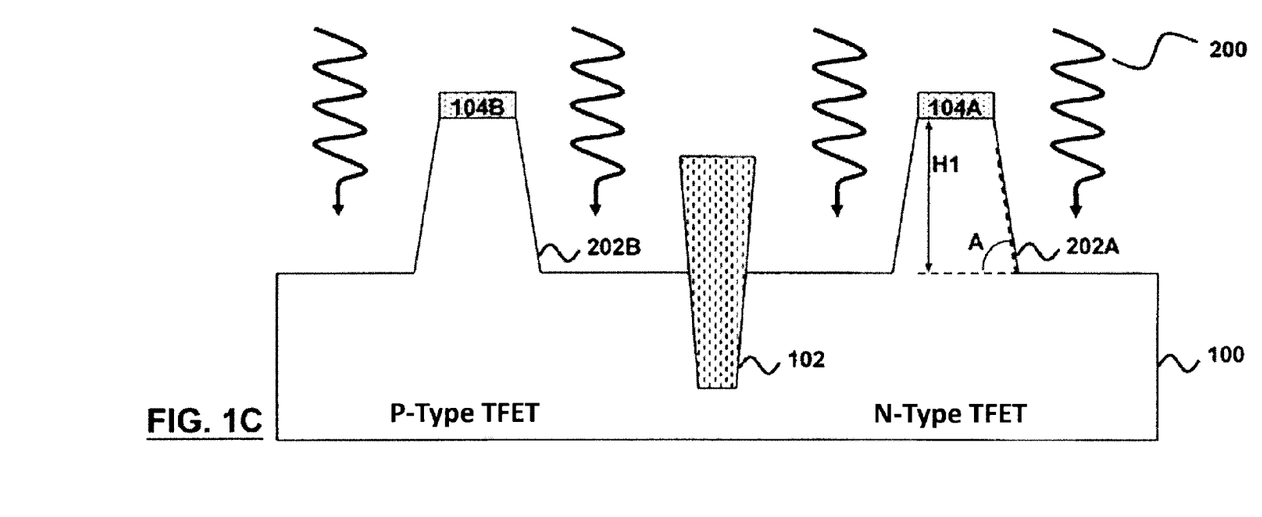
Figure 1D:
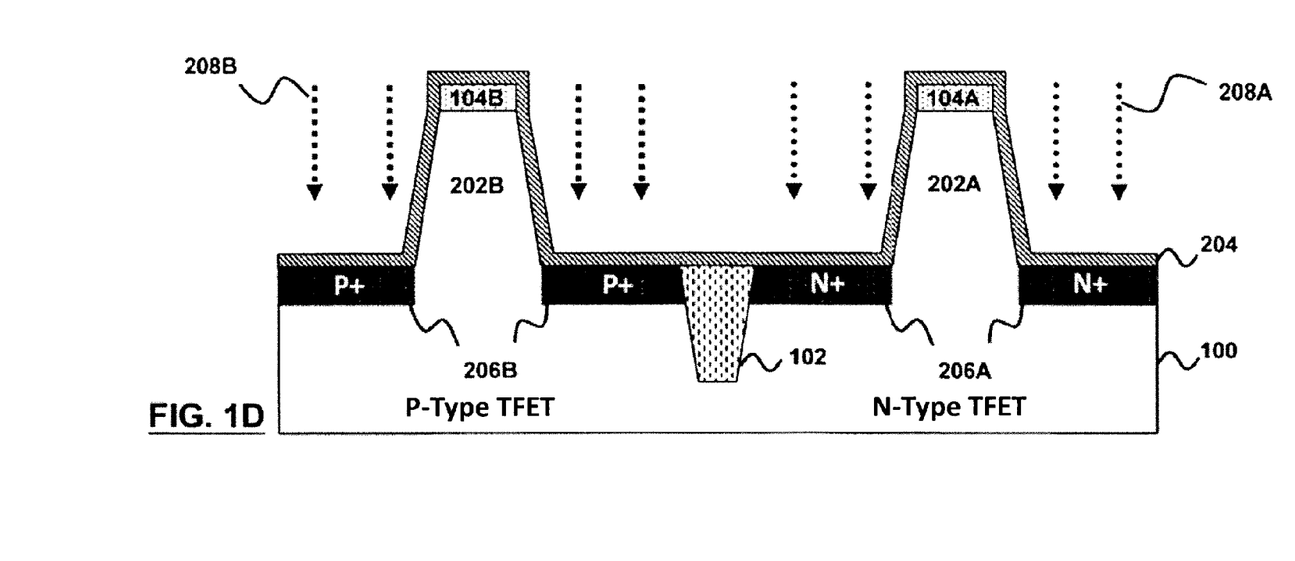
Figure 1E:
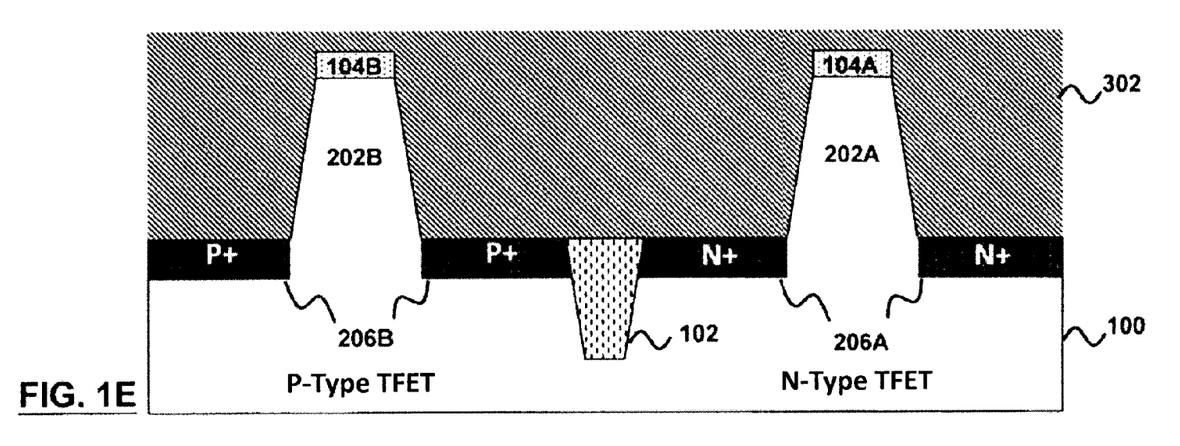
Figure 1F:
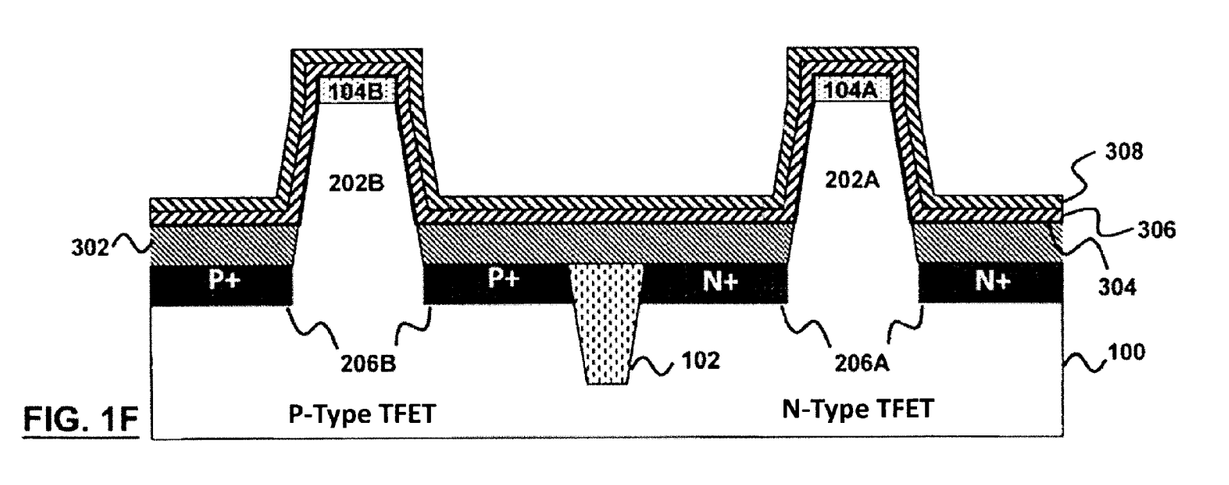
Figure 1G:
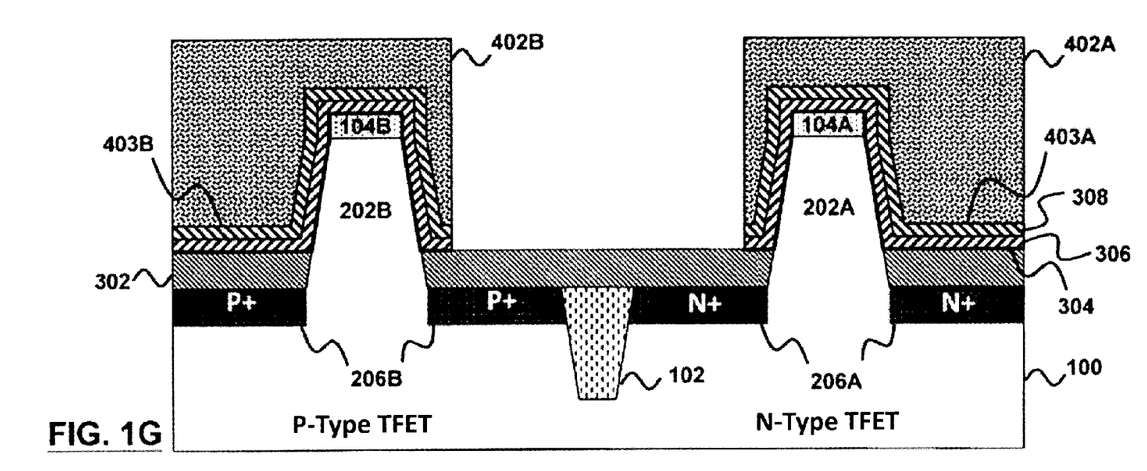
Figure 1H:
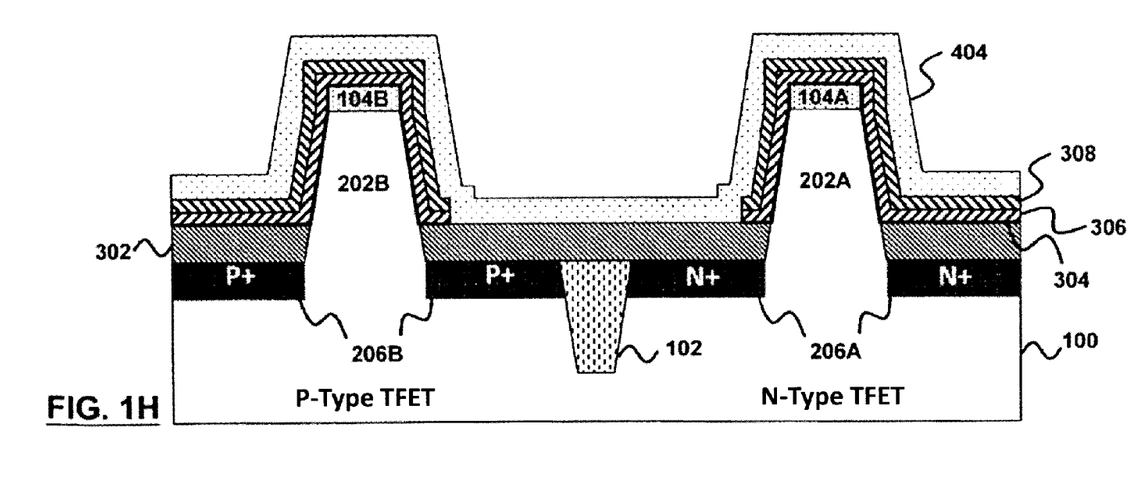
Figure 1I:
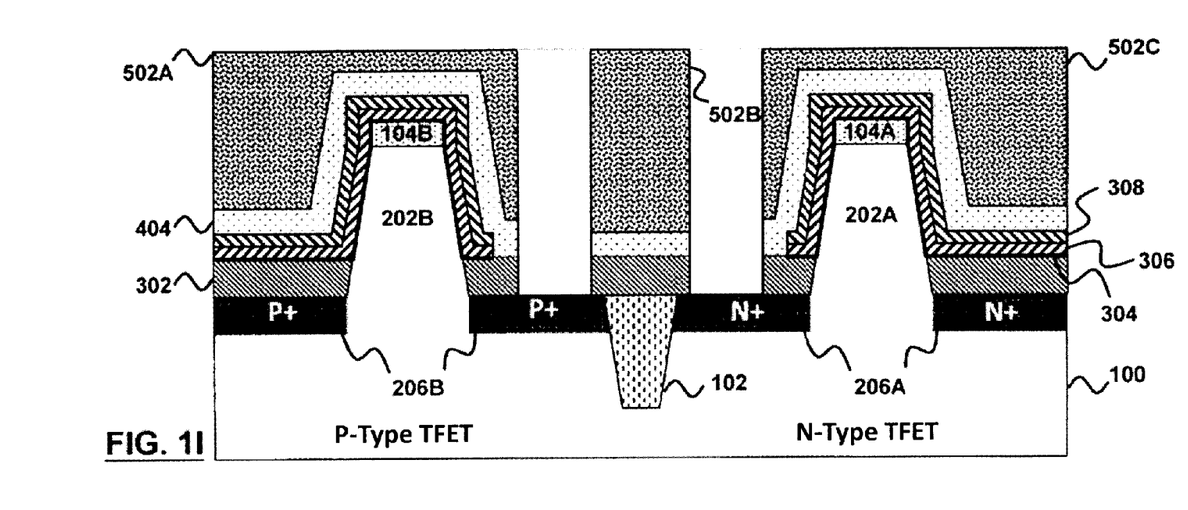
Figure 1J:
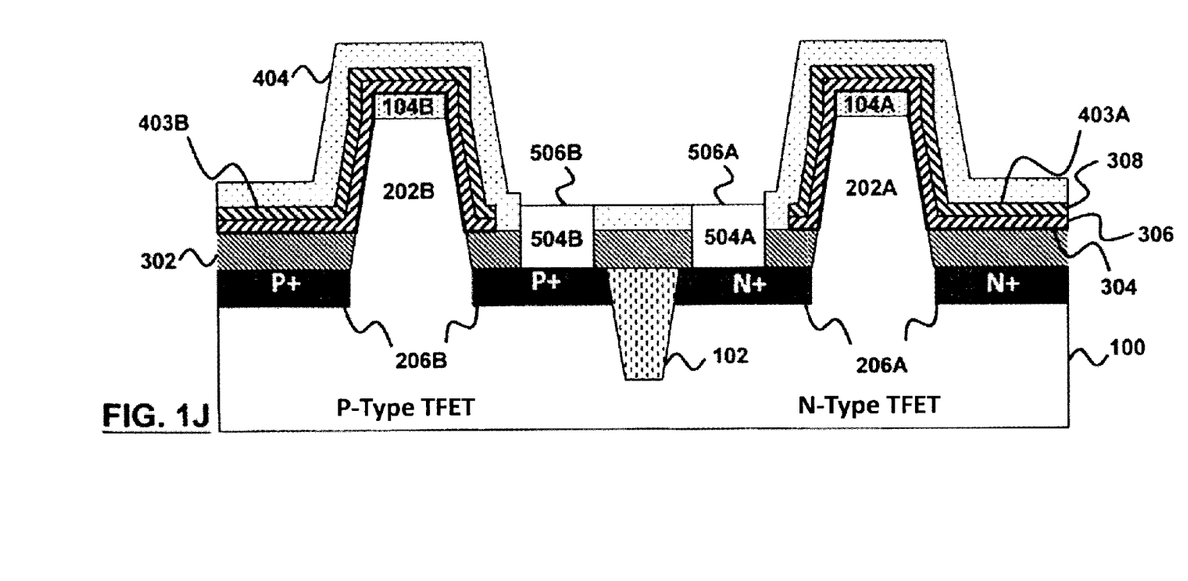
Figure 1K:
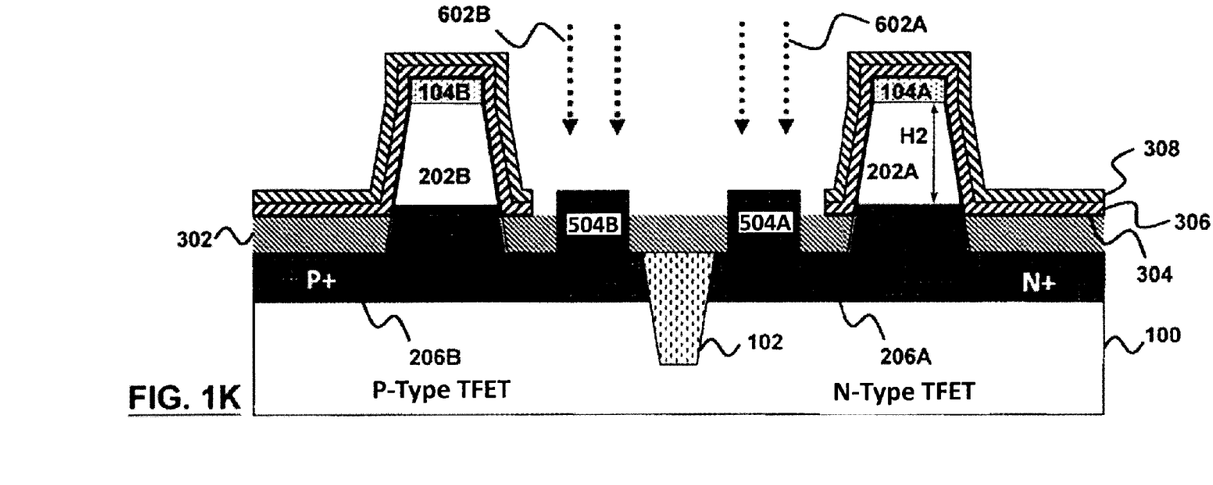
Figure 1L:
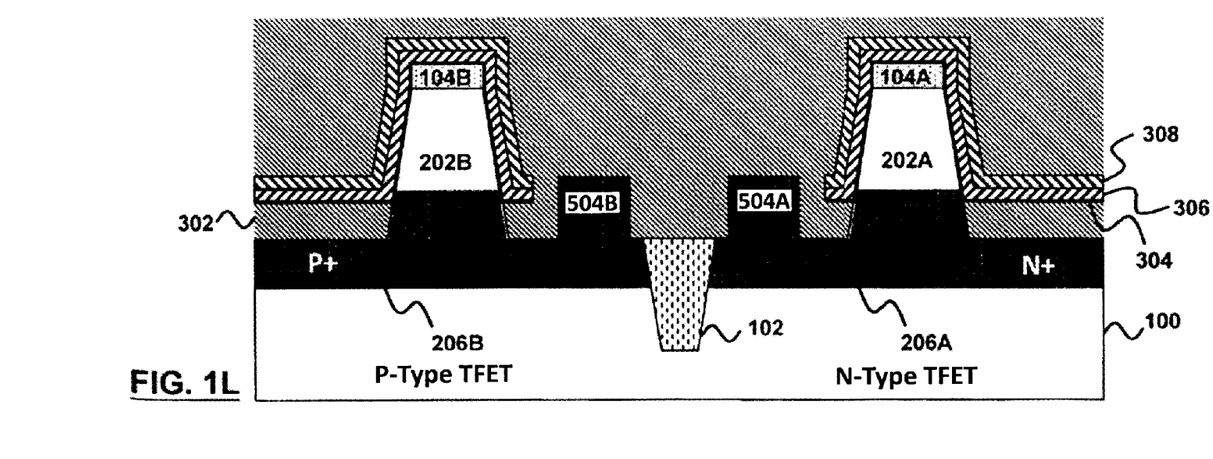
Figure 1M:
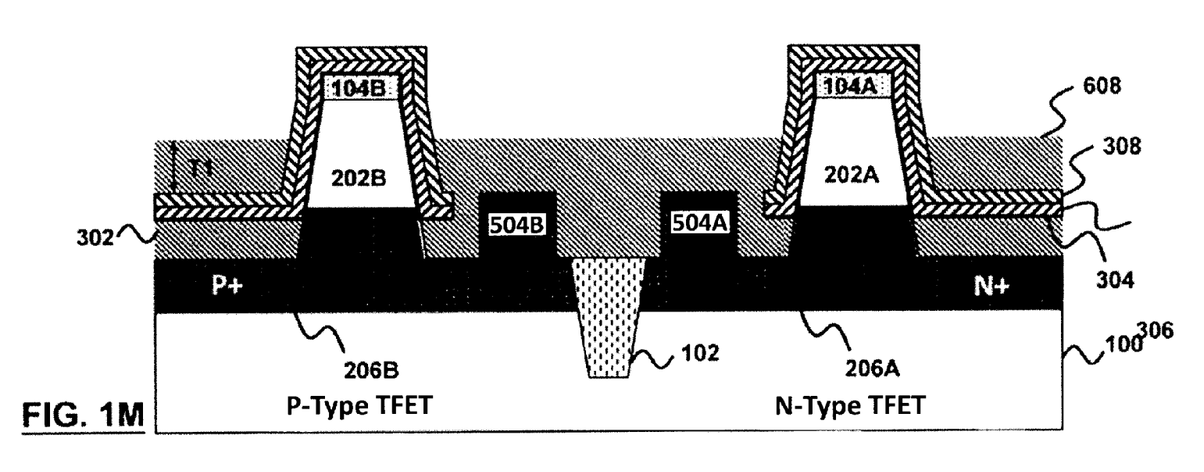
Figure 1N:
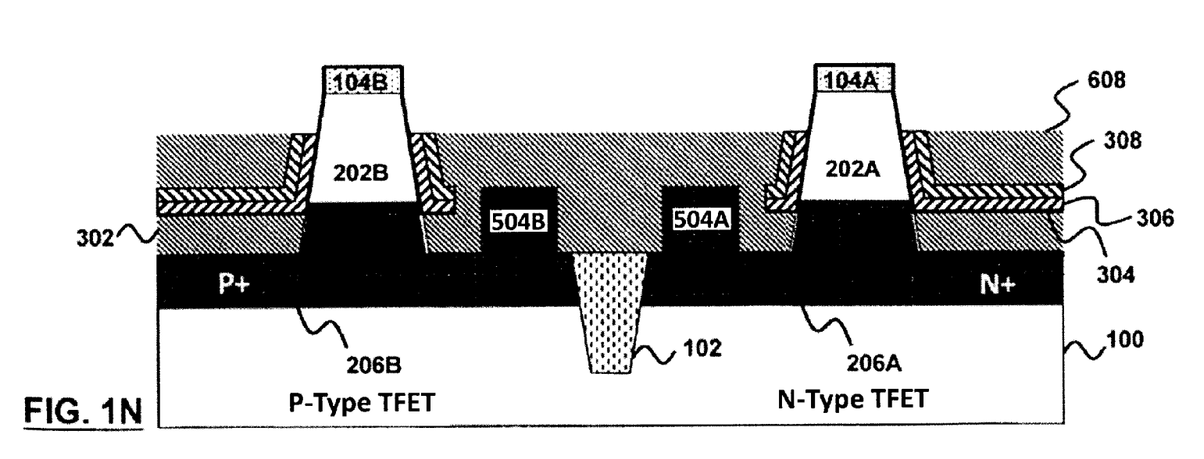
Figure 1O:
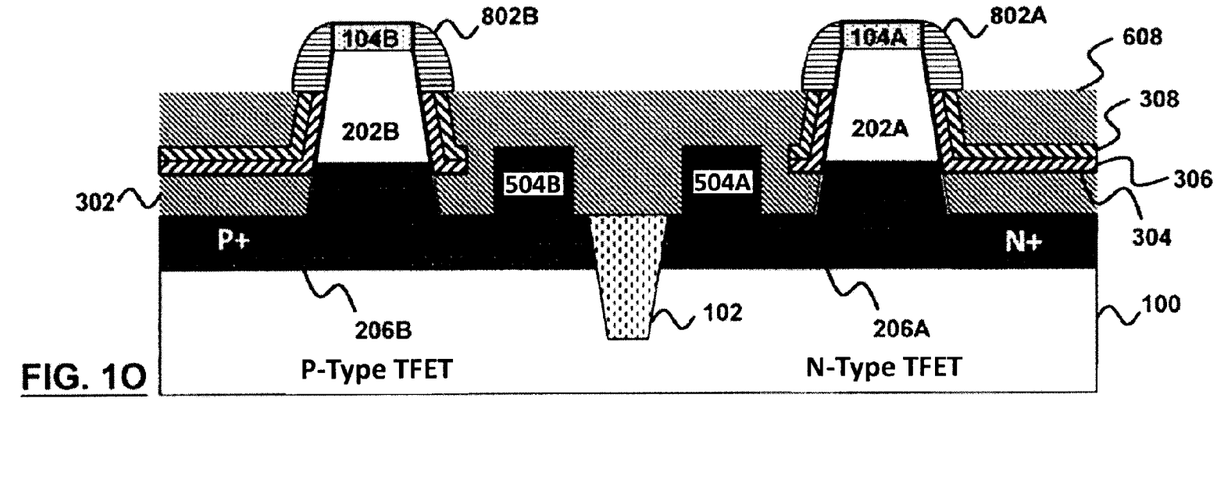
Figure 1P:
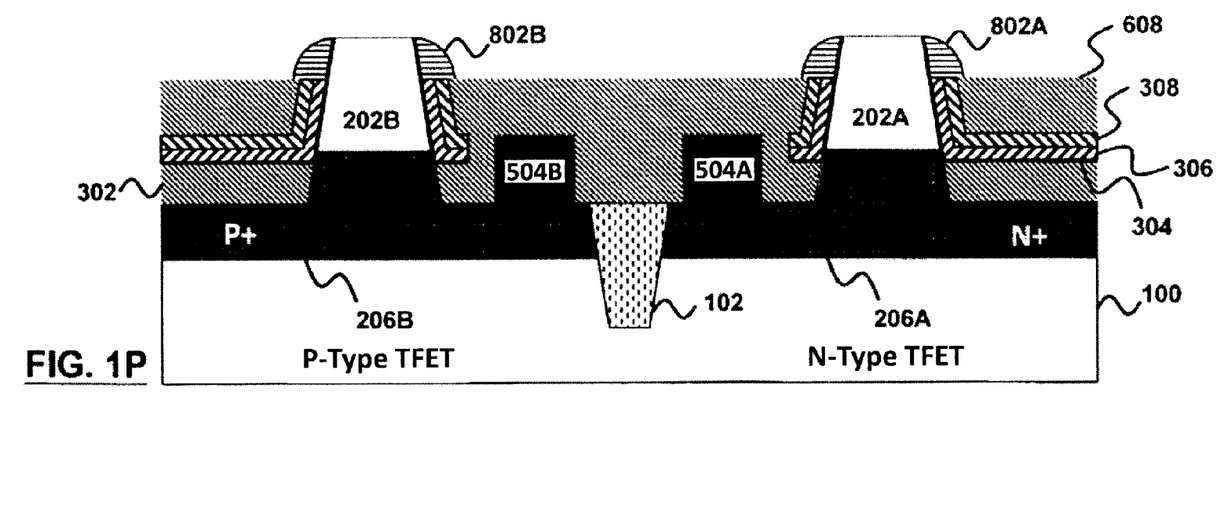
Figure 1Q:
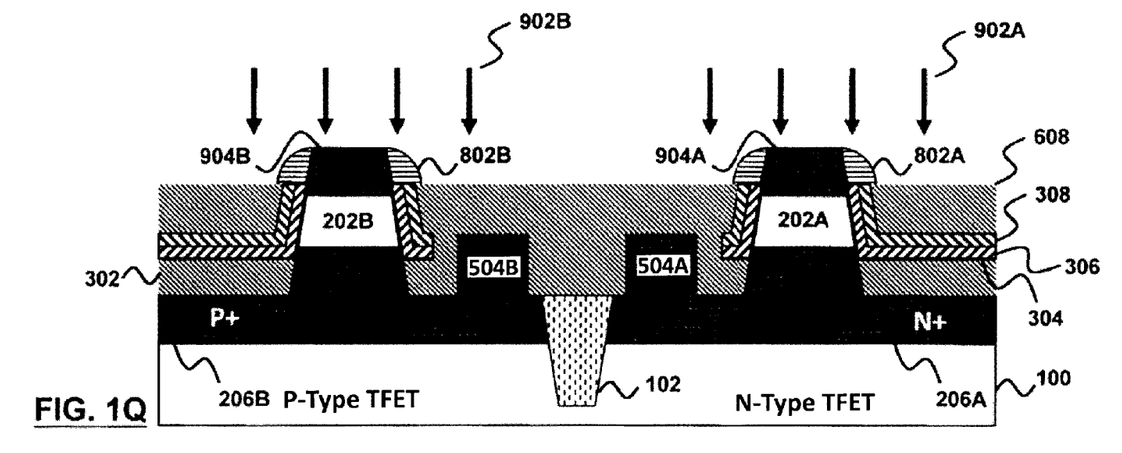
Figure 1R:
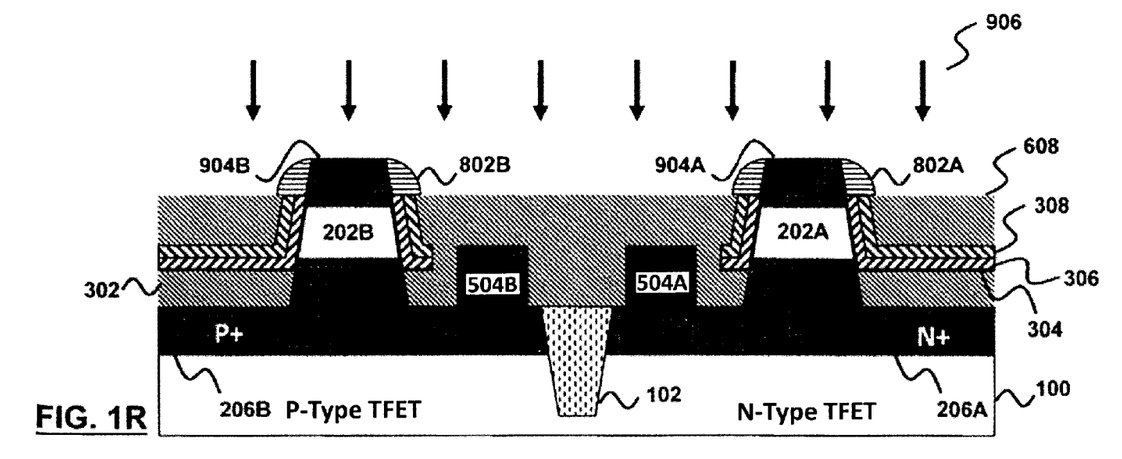
Figure 1S:
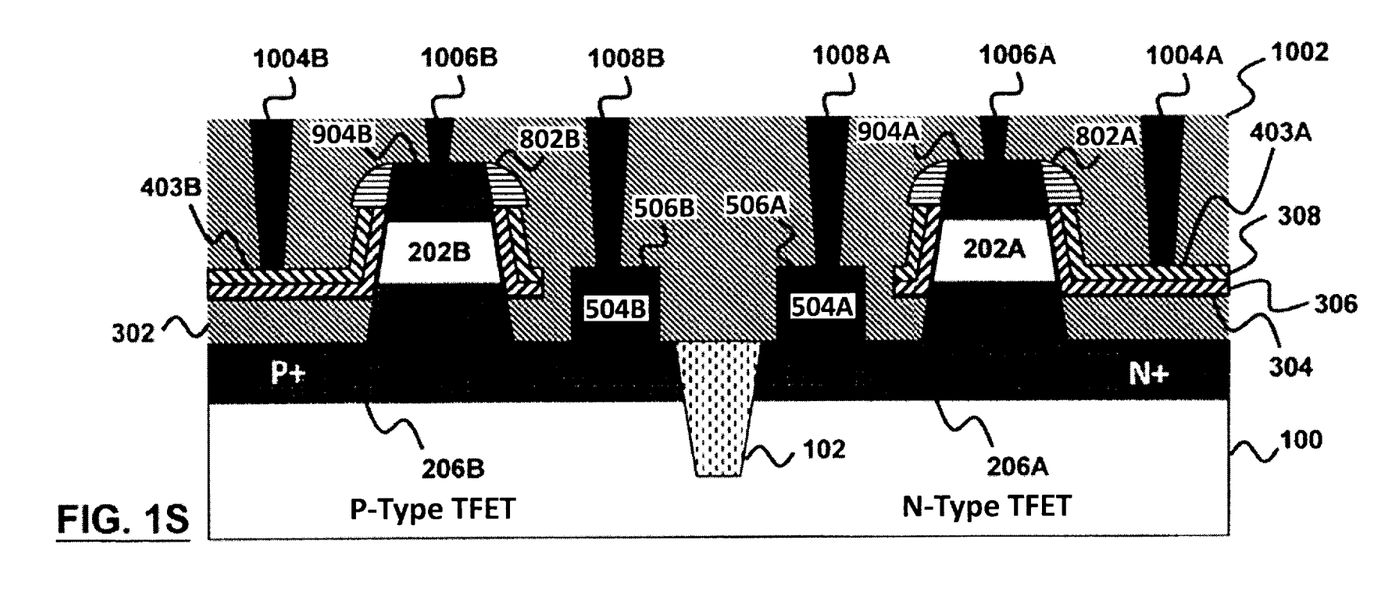

FIGS. 1A-1S present a series of fragmentary, cross-sectional diagrams of a semiconductor substrate 100 in various process stages by which a pair of gate-all-around (GAA) tunneling field-effect transistors (TFETs) are formed as seen in FIG. 1S. In FIGS. 1A-1S, a portion of substrate 100 is depicted, and other structures and processes may be formed or used on other portions of substrate 100 without departing from the scope of this disclosure. In the depicted embodiment, the features on the right half of the substrate 100 in FIGS. 1A-1S depict an N-type TFET (NFET), while the features on the left half of the substrate 100 depict a P-type TFET (PFET).

FIG. 1A depicts a portion of substrate 100. In the depicted embodiment, substrate 100 is a silicon substrate. In other embodiments, substrate 100 includes other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Also, a shallow trench isolation feature (STI) 102 is depicted in FIG. 1A. STI 102 isolates various devices and features on substrate 100 from each other. In an example, STI 102 is formed by etching a trench in substrate 100 and then filling the trench with an electrically insulating material such as silicon oxide.

FIG. 1B depicts two hard mask portions, including hard mask portion 104A and hard mask portion 104B. In an example, hard mask portions 104A and 104B are formed from a hard mask layer of SiN deposited on the surface of substrate 100 by chemical vapor deposition (CVD). A masking layer, such as a photoresist (PR) layer, is formed over the hard mask layer and patterned using photolithographic techniques. The masking layer may also be patterned by other processes such as e-beam lithography. As depicted, the patterned mask layer portions, mask portion 106A and mask portion 106B, remain after patterning. Mask portions 106A and 106B are then used to pattern the hard mask layer into hard mask portions 104A and 104B. In the depicted embodiment, mask portions 106A and 106B and hard mask portions 104A and 104B are circular in shape as viewed from above. In an example, the circular shape of hard mask portions 104A, 104B is less than about 100 nm in diameter.

FIG. 1C depicts substrate 100 being subjected to an etch process 200 to form a protrusion 202A and a protrusion 202B. As depicted, etch process 200 is a dry etch. In some embodiments, etch process 200 is a plasma etch using $CF_4$, $SF_6$, $Cl_2$, $O_2$, other gas as an etch gas, or combination thereof. As depicted, etch process 200 is also a selective etch, such that substrate 100 is etched faster than STI 102. Alternatively, a dry etch using $CF_4$, $H_2$, $O_2$, $N_2$, or other suitable etch gas may be used to reduce STI 102 as described. In an example, etch process 200 may remove from about 50 nm to about 200 nm of silicon from the exposed surface of substrate 100. Thus, protrusions 202A and 202B may have a height "H1" ranging from about 50 nm to about 200 nm.

Because of the hard mask portions 104A and 104B, etch process 200 results in the two silicon protrusions 202A and 202B centered underneath hard mask portions 104A and 104B, respectively. As depicted in FIG. 1C, sidewalls or profiles of protrusions 202A and 202B are not perpendicular to the surface of substrate 100, but rather, are angled with respect to it. Thus, in many embodiments, protrusions 202A and 202B are tapered. The angle of the tapering is labeled as angle "A" in FIG. 1C. In various embodiments, angle "A", formed by the sidewalls of protrusions 202A and 202B, ranges from about 45 degrees to about 90 degrees as measured inside the protrusions 202A and 202B with respect to the planar surface of substrate 100. In embodiments in which the angle is about 90 degrees, protrusions 202A and 202B are substantially cylindrical in shape. As depicted, where the angle is less than 90 degrees, protrusions 202A and 202B are frustums in shape, i.e., are frustoconical protrusions 202A and 202B.

FIG. 1D depicts a screening layer 204 overlaying the exposed surfaces of substrate 100, STI 102, and hard mask portions 104A and 104B. A wet etch may be used after etch process 200 to reduce STI 102 to be substantially level with the surface of substrate 100 before screening layer 204 is deposited. As depicted, screening layer 204 is an oxide layer, ranging from about 10 to 40 angstroms in thickness. An N-type region 206A is formed by an N-type implant process 208A. In the depicted embodiment, the implanted N-type dopants are phosphorous, while in other embodiments, the N-type dopants may be arsenic or other suitable dopants. A P-type region 206B is formed by a P-type implant process 208B that implants boron or another P-type dopants. Due to the angle of the sidewalls of protrusions 202A and 202B, the thickness of screening layer 204 is effectively less on the planar surface of substrate 100 than on the protrusions 202A and 202B. And due to the effective thickness of screening oxide 204 on protrusions 202A and 202B, protrusions 202A and 202B do not receive significant dopants during implant processes 208A and 208B, while the planar surfaces of substrate 100 do.

As depicted in cross-section in FIG. 1D, N-type region 206A and P-type region 206B may appear to comprise two separate doped regions each. However, as viewed from above, the two separate doped regions of each of N-type region 206A and P-type region 206B may actually be contiguous doped regions having a donut-like shape. A process to activate the dopants implanted by implant processes 208A and 208B is not performed at this stage of processing.

FIG. 1E includes a dielectric layer 302 is formed over the substrate 100. In the present example, the screening layer 204 is removed before forming the dielectric layer 302. In some embodiments, screening layer 204 remains over the substrate 100 when the dielectric layer 302 is formed. After deposition of the dielectric layer 302 over the substrate 100, the dielectric layer 302 may have significant topography. As depicted in FIG. 1E, the dielectric layer 302 undergoes a chemo-mechanical planarization (CMP) process to planarize the dielectric layer 302, thereby removing this topography. In some embodiments, the CMP process may be stopped when hard mask portions 104A, 104B are exposed.

FIG. 1F depicts several additional layers deposited after an etching process removes a substantial amount of dielectric layer 302. In FIG. 1F, the dielectric layer 302 is etched back and then various gate layers are formed over the substrate 100. In an example, dielectric layer 302 is etched back by a wet etch to a thickness range from about 15 to about 60 angstroms. In the present example, after dielectric layer 302 is etched, an interfacial layer 304 is deposited. Interfacial layer 304 may include a plurality of layers. For instance, the interfacial layer 304 may include an oxide layer and a high dielectric constant (high-k) material layer.

As depicted, interfacial layer 304 includes an oxide layer and a high-k material layer formed from HfO. In additional embodiments, interfacial layer 304, or sublayers thereof, may be formed from many different materials, including NiO, TiO, HfO, ZrO, ZnO, $WO_3$, $Al_2O_3$, TaO, MoO, and CuO, and high-k materials such as $TiO_2$, $Ta_2O_5$, $Y_2O_3$, $La_2O_5$, $HfO_2$, and other materials. A metal gate layer 306 and a doped polysilicon gate layer 308 are formed over the interfacial layer 304. In some embodiments, the polysilicon gate layer 308 may be removed and replaced with an additional metal layer. In such embodiments, polysilicon gate layer 308 may be an undoped polysilicon layer. Metal gate layer 306 and polysilicon gate layer 308 may form a tunneling control surface that surrounds a portion of protrusions 202A and 202B and a gate contact surface that is substantially planar and configured to receive an electrical contact.

In FIG. 1G, a masking layer is formed and patterned into mask portions 402A and 402B to define gate regions for the NFET and PFET regions of the substrate 100. In the depicted embodiment, masking layer is a PR layer that is patterned to form mark portions 402A and 402B. After mask portions 402A and 402B are formed, exposed portions of polysilicon gate layer 308, metal gate layer 306, and interfacial layer 304 are removed, thereby exposing the dielectric layer 302. This electrically separates gate regions of the TFETs from each other. The NFET gate on the right includes a gate contact surface 403A, while the PFET gate on the left of FIG. 1G includes a gate contact surface 403B. Gate contact surfaces 403A and 403B will be discussed more below. In FIG. 1H, the mask portions 402A and 402B are removed, and a dummy layer 404 is deposited. In an example, the dummy layer 404 is an oxide/nitride layer deposited by CVD, but other layers may be used in dummy layer 404 in other embodiments.

FIG. 1I depicts a masking layer that is deposited and patterned to form mask portions 502A, 502B, and 502C. As depicted, mask portions 502A, 502B, 502C are patterned from a PR masking layer. Mask portions 502A, 502B, 502C serve as masking layers for removing exposed portions of dummy layer 404 and dielectric layer 302. The removal of these layers exposes two portions of substrate 100. As depicted in FIG. 1J, raised portions 504A and 504B are epitaxially grown from the exposed portions of substrate 100. Raised portions 504A and 504B are grown until a surface of the raised portions 504A, 504B are substantially coplanar with the gate contact surfaces 403A and 403B (in the depicted embodiment, substantially coplanar with contact surfaces of the polysilicon gate layer 308). In the present example, top surfaces 506A and 506B respectively of the raised portions 504A and 504B are drain contact surfaces. Thus, the depicted top surface of raised portion 504A is referred to as the drain contact surface 506A, the depicted top surface of raised portion 504B is the drain contact surface 506B, and the drain contact surfaces 506A and 506B are substantially coplanar with gate contact surfaces 403A and 403B.

FIG. 1K depicts an N-type implant process 602A and a P-type implant process 602B. N-type implant process 602A implants N-type dopants into the raised portion 504A, while P-type implant process 602B implants P-type dopants into the raised portion 504B. After this implant process, dummy layer 404 is removed as depicted.

Additionally, as depicted in FIG. 1K, the features on substrate 100 undergo a dopant activation process. In the present example, the dopant activation process is a rapid thermal annealing (RTA) process that both diffuses and activates the dopants. Other embodiments may include other diffusion/activation processes as known in the art. By controlling the implant dosage and RTA conditions, the raised portions 504A and 504B are electrically joined to the underlying N-type and P-type drain regions 206A and 206B formed in substrate.

Additionally, the dopants are diffused laterally underneath and vertically into protrusions 202A and 202B, raising the drain regions 206A and 206B within protrusions 202A and 202B above a top surface of the dielectric layer 302. The dopants are raised so that the drain regions 206A and 206B overlap with corresponding portions of metal gate layer 306 that form tunneling control surfaces. In the depicted embodiment, the drain regions 206A and 206B are raised to about 5 angstroms above the top surface of the dielectric layer 302. An undoped height "H2" within each protrusion 202A and 202B remains after the activation/diffusion process. Undoped height "H2" of protrusions 202A and 202B is about two-thirds of the full height "H1" as seen in FIG. 1C. Thus, in some embodiments, the desired proper undoped height "H2" is achieved when around one-third of the full height "H1" of protrusions 202A and 202B is doped by diffusion from the underlying drain regions 206A and 206B.

FIG. 1L depicts a dielectric layer 608 formed over the substrate 100. In the present example, the dielectric layer 608 is deposited by CVD with a thickness that exceeds the topmost portion of polysilicon gate layer 308 situated on top of protrusions 202A and 202B. In the depicted embodiment, the dielectric layer 608 is an oxide layer. A CMP process is performed to planarize dielectric layer 608. The dielectric layer 608 is then etched back until a top surface of the dielectric layer 608 is below a top surface of the protrusions 202A and 202B, as depicted in FIG. 1M. In an example, the etch back process is a wet etch that removes enough material from dielectric layer 608 so that a remaining thickness "T1" of dielectric layer 608 is about 20 angstroms to about 80 angstroms. In general, remaining thickness "T1" of additional dielectric layer 608 is less than the height 606 of the undoped portions of protrusions 202A and 202B.

As depicted in FIG. 1N, portions of polysilicon gate layer 308 and metal gate layer 306 that are not covered by dielectric layer 608 are removed by an etching process. The etch process may be a selective etch process that does not remove the portions of the interfacial layer 304 that are not covered by the dielectric layer 608. In the depicted embodiment, the etch process is a selective etch process which also does not remove substantial amounts of dielectric layer 608.

FIG. 1O depicts spacers 802A and 802B that respectively ring exposed portions of protrusions 202A and 202B, still having interfacial layer 304 thereon, and hard mask portions 104A and 104B. Spacers 802A, 802B are formed by deposition and then etching. In the depicted embodiment, a layer of SiN is deposited with CVD and then etched to form SiN spacers 802A and 802B. FIG. 1P depicts a hard mask removal process that removes both the exposed portions of interfacial layer 304 and hard mask portions 104A and 104B and reshapes hard mask spacers 802A and 802B so that they are substantially level with the top of protrusions 202A and 202B. In the depicted embodiment, this is accomplished by a photoresist etchback method.

FIG. 1Q depicts P-type implant process 902A and N-type implant process 902B. Implant process 902A implants P-type dopants into the exposed portion of protrusion 202A to create a P-type source region 904A, while implant process 902B implants N-type dopants into the exposed portion of protrusion 202B to create an N-type source region 904B. Polysilicon gate layer 308 and metal gate layer 306 are protected from the implant processes 902A and 902B by spacers 802A and 802B. The depth of source regions 904A and 904B is controlled by the implant energy. To form an abrupt source/channel interface, a laser spike annealing (LSA) process 906 is used in the embodiment depicted in FIG. 1R. Other annealing/activation processes may be used in other embodiments.

Finally, FIG. 1S depicts a dielectric layer 1002 that has a thickness so that its top surface is above the top of source regions 904A and 904B. In the depicted embodiments, dielectric layer 1002 is an oxide layer. Contacts are formed through dielectric layer 1002 to connect the drain, gate, and source of each of the two TFETs to the top surface of dielectric layer 1002. Gate contacts 1004A and 1004B are respectively coupled to the gate contact surfaces 403A and 403B; source contacts 1006A and 1006B are respectively coupled to source regions 904A and 904B; and drain contacts 1008A and 1008B are respectively coupled to the drain contact surfaces 506A and 506B. In the depicted embodiment, as noted above, drain contact surfaces 506A and 506B are substantially coplanar with gate contact surfaces 403A and 403B, which may allow them to be formed more uniformly in the same process steps. Thus, by having raised portions 504A and 504B that elevate drain contact surfaces 506A and 506B, drain contacts 1004A and 1004B may be fabricated in fewer process steps with improved uniformity.

Figure 2:
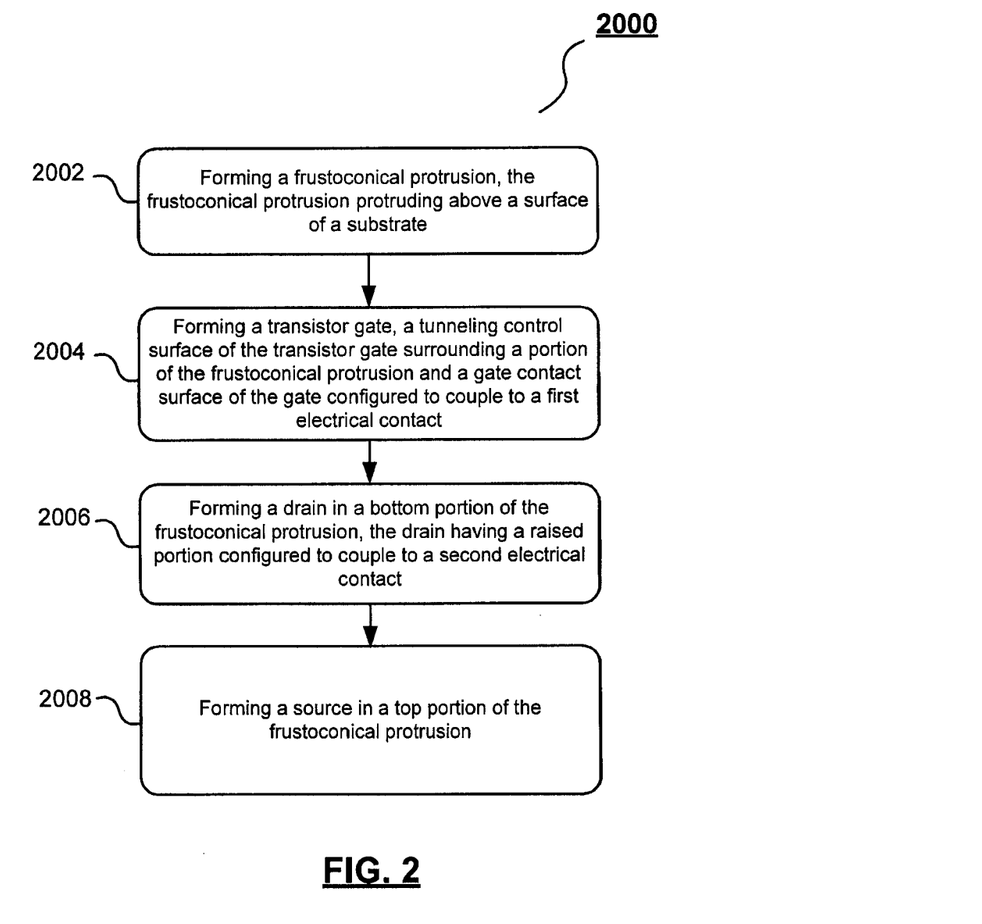
FIG. 2 is a flowchart of a method for fabricating a tunneling FET with a raised drain structure according to various embodiments of the present disclosure.

FIG. 2 is a flowchart of a method 2000 for forming a field-effect transistor with a raised drain structure as depicted in FIGS. 1A-1S. Method 2000 may begin in step 2002 when a frustoconical protrusion is formed by etching a semiconducting substrate. The frustoconical protrusion may be formed by etching the semiconducting substrate while having a circular hard mask structure on the surface thereof. By removing material, the frustoconical protrusion protrudes above the etched, planar surface of the semiconducting substrate. In step 2004, a gate is formed that has a tunneling control surface, a portion of the gate that surrounds a portion of the frustoconical source. The gate also has a gate contact surface configured to couple to an electrical contact. In step 2006, a drain is formed that has a raised portion configured to couple to another electrical contact. A portion of the drain is formed in the bottom portion of the frustoconical protrusion. In step 2008, a source is formed in a top portion of the frustoconical protrusion.

To better describe method 2000, reference will be made to a number of the process steps and features described in the embodiment depicted in FIGS. 1A-1S. The following should be regarded as but a single embodiment among many. In this embodiment, the frustoconical protrusion is formed after a circular hard mask portion such as hard mask portion 104A has been used to pattern a silicon substrate 100. A dry etch process is used to etch the exposed portions of the silicon substrate 100. This dry etch results in the frustoconical protrusion 202A that protrudes up from an etched, planar surface of substrate 100 in step 2002.

In step 2004, a transistor gate is formed by depositing a metal gate layer 306 and a polysilicon gate layer 308 onto the surface of substrate 100 after it has been partially covered by a dielectric layer 302. An interfacial layer is deposited prior, so insulate the frustoconical protrusion 202A from the metal gate layer 306, and to serve as a gate dielectric layer. The metal gate layer 306 and polysilicon layer 308 are patterned to great a gate structure that has a tunneling control surface and a contact surface. The tunneling control surface is the portion that surrounds the frustoconical protrusion 202A, while the contact surface is a planar surface parallel to the surface of the substrate which can be connected by contacts to external circuitry.

Additionally, a drain is formed as part of method 2000 in step 2006. The drain is formed by first forming an oxide screening layer 204 and then implanting dopants through the screening oxide. The screening oxide's thickness is controlled and the frustoconical protrusion 202A is angled, so that the dopants can pass through the screening oxide where the screening oxide is parallel to the planar surface of the etched substrate 100, but not where the screening oxide contacts the protrusion. This implantation process may occur before some or all of the processes that may occur in step 2004 as described above. The drain is formed within a raised portion, such as raised portion 504A as seen in FIG. 1K, by exposing an area of the doped substrate and epitaxially growing the raised portion on the exposed area. The top surface of the raised portion serves as a drain contact surface. The drain contact surface is coplanar with the contact surface of the transistor gate formed in step 2004.

By doping the raised portion with the same dopants used in the underlying doped substrate, and then activating and diffusing the dopants in both the raised portion and the doped substrate, the doped regions in both may merge into a single doped region, effectively extending the doped substrate up into the doped raised portion of epitaxially grown material. The activation is performed by rapid thermal annealing, and may be performed after all of the processes indicated above in the discussion of step 2004. The diffusion caused by the annealing process may also cause dopants to rise up into the tapered protrusion, creating a portion of the drain within the tapered protrusion. The dopants may, by controlling the activation/diffusion process or processes, rise up past the lower level of the gate.

In step 2008, a source is formed in the top portion of the frustoconical protrusion. This is done by first depositing and patterning a spacer 802A that rings or surrounds the top of the frustoconical protrusion and covered the top-most edges of the interfacial layer 304, the metal gate layer 306, and the polysilicon gate layer 308 to prevent dopants from entering these layers.

Additionally, method 2000 may include forming contacts that connect to the drain contact surface on the raised portion of the drain, to the source, and to the contact surface of the transistor gate. This may be done by etching vias through a dielectric layer 1002, and filling the vias with a conducting metal, such as tungsten. Processing advantaged may be achieved by having the contacts that connect to the drain contact surface and the gate contact surface be the same height. Method 2000 may result in a tunneling PFET and/or a tunneling NFET depending on the dopants used, as discussed above.

One of the broader forms of the present disclosure involves a transistor that includes a transistor gate, a source region; and a drain region with a top surface. The top surface of the drain may be coplanar with a top surface of the transistor gate. In some embodiments, the source region and a portion of the drain region are formed on opposite ends of a frustum, where the frustum is formed from a semiconducting substrate, and a surrounding portion of the transistor gate which surrounds a portion of the frustum such that the surrounding portion contacts both the source region and the portion of the drain region. The semiconductor device may be configured so that the top surface of the drain is a top surface of a raised platform epitaxially grown from a surface of a semiconducting substrate.

Some embodiments also include at least one dielectric layer situated between the transistor gate and the source and drain regions. In such embodiments, the transistor gate overlaps a portion of the source region and a portion of the drain region, the overlapped portion of the source region having a circumference that is smaller than a circumference of the overlapped portion of the drain region. The at least one dielectric layer includes an interfacial layer and a high dielectric constant (high-k) layer. In additional embodiments, the semiconductor device further includes a gate contact and a drain contact that have the same height.

One of the other broader forms of the present disclosure is a semiconductor device that includes an N-type tunneling field-effect transistor (TFET) having a frustoconical protrusion that has a source; a transistor gate having a contact surface and a tunneling control surface, the tunneling control surface surrounding a portion of the frustoconical source; and a drain, a portion of the drain being raised above a surface of a substrate so as to be coplanar with the contact surface of the transistor gate.

The tunneling control surface surrounds a portion of the frustoconical source. The N-type TFET also has a drain in which a portion of the drain is raised above a substrate so as to be at the same level above the substrate as the contact surface of the transistor gate. The contact surface of the transistor gate is parallel to a surface of the substrate, and the source region, the tunneling control surface, and the portion of the drain are coaxial. In some embodiments, the semiconductor device also includes a p-type TFET having an additional source, an additional transistor gate; and an additional drain. A portion of the additional drain is raised above the substrate so as to provide a drain contact surface that is coplanar with a contact surface of the transistor gate and a contact surface of the additional transistor gate.

Another of the broader forms of the present disclosure is a method for forming a field-effect transistor. The method includes forming a tapered source by etching a semiconductor substrate, the conical source protruding above a planar surface of the semiconductor substrate, and forming a gate, a first portion of the gate surrounding a portion of the tapered source and a second portion of the gate configured to couple to a first electrical contact. The method also includes forming a drain that has a raised portion configured to couple to a second electrical contact. The raised portion of the drain and the second portion of the gate are located at a same level above the planar surface of the semiconductor substrate. Some embodiments may also include forming contacts to the gate and the drain, the contacts to the drain and the gate having the same height, and doping portions of the semiconductor substrate through a screening layer. The screening layer permits dopants to pass through to the semiconductor substrate where the screening layer is parallel to the planar surface of the semiconductor substrate in order to form a plurality of drain regions.

In some embodiments, forming the drain having the raised portion configured to couple to the second electrical contact includes epitaxially growing the raised portion on top of a doped portion of the planar surface of the substrate, doping the raised portion with the dopants used to dope the portion of the planar surface of the substrate underlying the raised portion; and activating the dopants in the plurality of drain regions and the raised portion by an annealing process. One of the drain regions and the raised portion are fused or mergers by a diffusion process, in some embodiments.

In additional embodiments, forming the drain having the raised portion configured to couple to the second electrical contact further includes doping portions of the planar surface of the semiconductor substrate with dopants and raising the dopants from the doped portions into a frustoconical protrusion so that the dopants are higher than a bottom level of the first portion of the gate by a diffusing process. Forming the tapered source includes doping a top portion of the frustoconical protrusion, a portion of the drain being formed in a bottom portion of the frustoconical protrusion, with an area of undoped semiconductor being situated in between the source and the portion of the drain.

The examples provided above are exemplary only and are not intended to be limiting. One skilled in the art may readily devise other systems consistent with the disclosed embodi-

What is claimed is:

1. A transistor comprising:
a gate having a gate contact surface;
a source region; and
a drain region having first and second drain portions, the first drain portion being surrounded by the gate, the second drain portion being raised and spaced away from the first drain portion and from the gate, the second drain portion having a drain contact surface, wherein the drain contact surface is a topmost surface of the raised second drain portion, the drain contact surface being substantially coplanar with the gate contact surface.

2. The transistor of claim 1, wherein the source region and the first portion of the drain region are formed on opposite ends of a frustum, the frustum being formed from a semiconducting substrate, wherein the gate surrounds a portion of the frustum such that the gate is electrically coupled with the source region and the first portion of the drain region.

3. The transistor of claim 2, wherein the drain contact surface is a top surface of a raised platform epitaxially grown from a surface of the semiconducting substrate.

4. The transistor of claim 1, further comprising a dielectric layer situated between the gate and the source and drain regions, the gate overlapping a portion of the source region and a portion of the first portion of the drain region, the overlapped portion of the source region having a circumference that is smaller than a circumference of the overlapped portion of the drain region.

5. The transistor of claim 1, further comprising a gate contact coupled with the gate contact surface and a drain contact coupled with the drain contact surface, the gate and drain contacts having a same height.

6. The transistor of claim 4, wherein the dielectric layer includes an interfacial layer and a high dielectric constant layer.

7. The transistor of claim 5, wherein the gate contact contacts the gate at an area of the gate that is separated from a surface plane of a semiconducting substrate by a dielectric layer, wherein the dielectric layer is not a gate dielectric layer.

8. A semiconductor device comprising:
an n-type tunneling field-effect transistor (TFET) having a frustoconical protrusion that includes:
a source;
a gate having a gate contact surface and a tunneling control surface, the tunneling control surface surrounding a portion of the frustoconical source; and
a drain having first and second portions, the first portion of the drain being surrounded by the gate, the second portion of the drain being spaced away from the first portion of the drain and from the gate, the second portion of the drain being raised above a surface of a substrate so as to have a top drain contact surface of the raised second portion that is substantially coplanar with the gate contact surface.

9. The semiconductor device of claim 8, wherein the source of the n-type TFET is doped with p-type dopants and the drain of the n-type TFET is doped with n-type dopants.

10. The semiconductor device of claim 9, wherein the gate contact surface is parallel to the surface of the substrate, and the tunneling control surface and the portion of the drain are coaxial.

11. A semiconductor device comprising:
an n-type tunneling field-effect transistor (TFET) having a frustoconical protrusion that includes:
a source,
a gate having a gate contact surface and a tunneling control surface, the tunneling control surface surrounding a portion of the frustoconical source, and
a drain, a portion of the drain being raised above a surface of a substrate so as to have a top drain contact surface of the raised portion that is substantially coplanar with the gate contact surface;
a p-type TFET that includes:
an additional source,
an additional gate having an additional gate contact surface; and
an additional drain, a portion of the additional drain being raised above the substrate so as to have a drain contact surface that is substantially coplanar with the additional gate contact surface.

12. The semiconductor device of claim 11, wherein the additional source of the p-type TFET is doped with n-type dopants and the additional drain of the p-type TFET is doped with p-type dopants.

13. The semiconductor device of claim 11, further comprising a shallow trench isolation feature between the n-type TFET and the p-type TFET.

14. A field-effect transistor device, comprising:
a conical protrusion, the protrusion protruding above a surface of a substrate;
a gate having a gate contact surface, wherein a tunneling control surface of the gate surrounds a portion of the protrusion;
a drain in a bottom portion of the protrusion, the drain including first and second portions, the first portion being surrounded by the gate, the second portion being spaced apart from the first portion and from the gate, the second portion being raised and having a top drain contact surface that is substantially coplanar with the gate contact surface; and
a source in a top portion of the protrusion.

15. The device of claim 14, further comprising:
electrical contacts to the gate, the drain, and the source such that a first electrical contact is coupled with the gate contact surface and a second electrical contact is coupled with the drain contact surface, the first and second electrical contacts having a same height.

16. The device of claim 14, wherein the drain includes a doped portion of the substrate formed through a screening layer parallel to the surface of the substrate.

17. The device of claim 16, wherein the second portion of the drain is epitaxially grown on the surface of the substrate over the doped portion;
wherein the epitaxially grown second portion is doped with a same type of dopants as used to dope the doped portion.

18. The device of claim 17, wherein dopants are diffused between the doped portion and the raised portion.

19. The device of claim 14, wherein the drain in the bottom portion of the conical protrusion further comprises:
dopants diffused through the substrate and the drain such that the dopants extend to a bottom level of the tunneling control surface of the gate, with a portion of the conical protrusion being surrounded by the gate.

20. The device of claim 14:
wherein the source is doped in the top portion of the conical protrusion,
and the device further including an undoped area of the substrate remaining between the source and the drain.

* * * * *